(12) United States Patent
Koo et al.

(10) Patent No.: US 7,768,097 B2
(45) Date of Patent: *Aug. 3, 2010

(54) INTEGRATED CIRCUIT PACKAGE HAVING AN INDUCTANCE LOOP FORMED FROM A MULTI-LOOP CONFIGURATION

(75) Inventors: Yido Koo, Seoul (KR); Hyungki Huh, Seoul (KR); Kang Yoon Lee, Seoul (KR); Jeong-Woo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/927,012

(22) Filed: Aug. 27, 2004

(65) Prior Publication Data

US 2005/0045986 A1 Mar. 3, 2005

Related U.S. Application Data

(60) Provisional application No. 60/498,354, filed on Aug. 28, 2003.

(51) Int. Cl.
*H01L 23/58* (2006.01)
*H01L 29/00* (2006.01)
*H03B 7/06* (2006.01)

(52) U.S. Cl. .............................. 257/531; 257/E23.059; 331/36 C; 331/167; 331/108 C

(58) Field of Classification Search ................ 257/528, 257/531, 678, 690, 693, 697, 784, 786, E23.05; 438/612; 336/210; 331/36 L, 117 R, 117 FE, 331/167, 108 C, 177 V See application file for complete search history.

(56) References Cited

U.S. PATENT DOCUMENTS 5,175,884 A 12/1992 Suarez (Continued)

OTHER PUBLICATIONS

U.S. Appl. No. 10/443,835, filed May 23, 2003, Koo et al.
J. Cranincks et al., Wireless CMOS Frequency Synthesizer Design, Chapter 4, Bonding Wire Inductance VCOS, pp. 89-120, Kluewer Academic Publishers 1998.

*Primary Examiner*—Matthew C. Landau
(74) *Attorney, Agent, or Firm*—Muir Patent Consulting, PLLC

(57) ABSTRACT

An integrated circuit package includes an inductance loop formed from a connection of lead wires and one or more input/output (I/O) package pins. In one embodiment, the inductance loop is formed from first and second wires which connect a first bonding pad on the integrated circuit chip to a first I/O pin of the package and a third and fourth wires which connect a second bonding pad on the chip to a second I/O pin of the package. To complete the inductor loop, the first and second I/O pins are connected by a third conductor between the pins. The third conductor may include one or more bonding wires and the I/O pins are preferably ones which are adjacent one another. However, the loop may be formed from non-adjacent connections of I/O pins based, for example, on loop-length requirements, space considerations, and/or other design or functional factors. In another embodiment, connection between the first and second I/O pins is established by making the I/O pins have a unitary construction. In another embodiment, connection between the first and second I/O pins is established by a metallization layer located either on the surface of the package substrate or within this substrate. By forming the inductor loop within the limits of the integrated circuit package, a substantial reduction in space requirements is realized, which, in turn, promotes miniaturization. Also, the integrated circuit may be implemented in any one of a variety of systems, at least one parameter of which is controlled by the length of the inductor loop of the package.

5 Claims, 13 Drawing Sheets

U.S. PATENT DOCUMENTS

| | | | |
|---|---|---|---|
| 5,477,194 A | 12/1995 | Nagakura | 331/10 |
| 5,739,730 A | 4/1998 | Rotzoll | |
| 5,839,184 A * | 11/1998 | Ho et al. | 29/605 |
| 5,886,393 A * | 3/1999 | Merrill et al. | 257/531 |
| 5,936,474 A | 8/1999 | Rousselin | |
| 5,963,100 A | 10/1999 | Tolson et al. | |
| 6,034,423 A * | 3/2000 | Mostafazadeh et al. | 257/691 |
| 6,137,372 A | 10/2000 | Welland | |
| 6,180,433 B1 * | 1/2001 | Furey et al. | 438/106 |
| 6,194,774 B1 * | 2/2001 | Cheon | 257/531 |
| 6,194,947 B1 | 2/2001 | Lee et al. | |
| 6,323,735 B1 | 11/2001 | Welland et al. | |
| 6,335,952 B1 | 1/2002 | Lee et al. | |
| 6,593,826 B2 | 7/2003 | See | |
| 6,608,367 B1 | 8/2003 | Gibson et al. | 257/666 |
| 6,661,301 B2 | 12/2003 | Traub | |
| 6,765,284 B2 * | 7/2004 | Gibson et al. | 257/666 |
| 6,803,665 B1 * | 10/2004 | Megahed et al. | 257/780 |
| 6,812,575 B2 * | 11/2004 | Furusawa | 257/774 |
| 6,876,266 B2 * | 4/2005 | Koo et al. | 331/117 R |

* cited by examiner

INTEGRATED CIRCUIT PACKAGE HAVING AN INDUCTANCE LOOP FORMED FROM A MULTI-LOOP CONFIGURATION

This application claims priority to Appl. No. 60/498,354 file Aug. 28, 2003, whose entire disclosure is incorporated herein by reference.

BACKGROUND OF THE INVENTION

1. Field of the Invention

This invention generally relates to integrated circuits, and more particularly to an integrated circuit package having an inductance loop formed from at least one input/output pin of the package. The invention also relates to a system which is at least partially controlled by the inductor loop of the package.

2. Description of the Related Art

One perennial goal among circuit designers is to decrease the size of integrated circuits. This goal is largely driven by market demand for ever-smaller consumer electronics, communications devices, and display systems to mention a few. There are, however, a number of impediments that undermine this goal, one of which will now be discussed.

Many integrated circuits are not self-contained devices. To ensure proper operation, these circuits must therefore be connected to one or more external components through connections which do not involve the use of an IC package input/output pin. This is accomplished, for example, by connecting the integrated circuit chip 1 to an off-package component 2 using bonding wires 3, as shown in FIG. 1. The need to establish off-package connections increases the cost and complexity of the manufacturing process and therefore is considered highly undesirable. These connections also expose the integrated circuit to an increased risk of damage from external influences, which translate into degradation in reliability and performance.

One conventional integrated circuit requiring off-package connections is routinely used in the frequency synthesizer of mobile communications devices such as cellular phones. Because the phase noise specifications are so stringent in these devices, voltage-controlled oscillators in a phase-locked loop used to generate the frequencies are typically based on some resonant structure. Ceramic resonators and LC tank circuits are common examples. While details in the implementation of LC tank oscillators differ, the general resonant structure includes an inductor connected in parallel with a fixed capacitor (C) and a variable capacitor ($C_x$). In the absence of any losses, energy passes between the capacitors and the inductor at a frequency $f_{out}=(1/2\pi)[L(C+C_x)]^{-1/2}$, with the inductance value L selected to control the operating band of the device.

In an integrated circuit which includes the aforementioned frequency synthesizer, the inductor used for band-selection purposes is located off-package (i.e., is circuit-board mounted). The use of off-package or board-mounted inductors increases system costs. Moreover, connection problems may occur between the package and board which may adversely affect the reliability and performance of the PLL circuitry.

Attempts have been made to overcome the drawbacks of these conventional devices. One approach, disclosed in U.S. Pat. No. 6,323,735, forms an inductor entirely within the integrated circuit package containing the phase-locked loop circuitry. This is accomplished using conductive wires which connect bonding pads on the IC chip to a same bonding pad on the package substrate. The connection between the pads and wires forms an inductance loop which controls the operational frequency band of the PLL circuitry. Multiple bonding pads may be included on the package substrate to form inductor loops of varying length. The loops are then selectively activated to effect a change in operational frequency.

The approach taken in the '735 patent is undesirable for at least two reasons. First, in order to form the inductor loop completely within the IC package, the package substrate must be formed to include bonding pads separate from the input/output package pins. The need to form these special pads increases the cost and complexity of the manufacturing process. Second, in order to accommodate the bonding pads, the size of the integrated circuit substrate must be increased and as a result more circuit board space is consumed. These effects undermine the goal of increasing integration and miniaturization.

Another approach, disclosed in the text "Wireless CMOS Frequency Synthesizer Design," by Craninckx, discloses a self-contained integrated circuit package containing an inductor loop. This loop is formed by connecting bonding wires between bonding pads on the IC chip and respective input/output pins of the IC package. The input/output pins are then connected by a third bonding wire. While this approach does not require the formation of special bonding pads on the package substrate, it is has at least two drawbacks that make it undesirable. First, like in the '735 patent, a bonding wire is used to connect the input/output pins. As previously noted, these wires are susceptible to damage during manufacture and/or use. Second, the input/output pins connected by the third bonding wire are located on opposite sides of the package. As a result, the third wire must pass over the IC chip. This is undesirable because the wire could short certain portions of the chip circuitry and introduce noise and other interfering influences which substantially degrade chip performance.

In view of the foregoing considerations, it is apparent that a need exists for an integrated circuit package which is more economical and requires fewer processing steps to manufacture than conventional IC packages, and which is also less susceptible to damage and noise which can degrade reliability and performance not only of the chip circuitry but also the host system of the chip. A need also exists for an integrated circuit package which is self-contained at least with respect to connection of an inductor loop connected to the chip, and which is able through this connection to achieve at least one of the aforementioned advantages.

SUMMARY OF THE INVENTION

An object of the present invention is to provide an integrated circuit package which is more economical and requires fewer processing steps to manufacture than conventional IC packages.

Another object of the present invention is to provide an integrated circuit package which is less susceptible to damage and noise which can degrade reliability and performance not only of the chip circuitry but also of the host system of the chip.

Another object of the present invention is to provide an integrated circuit package which is self-contained at least with respect to connection of an inductor loop to the IC chip and which is able through this connection to achieve at least one of the aforementioned advantages.

Another object of at least one embodiment of the present invention is to accomplish one or more of the aforementioned objects by forming the inductor loop from multiple sub-loops, which increase the effective inductance of the loop by an amount proportional to a sum of the lengths of the sub-loops.

Another object of the present invention is to provide an integrated circuit package which does not require special bonding pads to be formed on the package substrate in order to form an inductor loop connected to the chip.

Another object of the present invention is to achieve one or more of the aforementioned objects by forming the inductor loop formed from at least one input/output pin of the package.

Another object of the present invention is to provide a system which is at least partially controlled by an integrated circuit package in accordance with any one of the aforementioned types.

These and other objects and advantages of the present invention are achieved by providing a semiconductor package comprising an integrated circuit chip and an inductor loop which is connected in a self-contained manner within the package. This self-contained connection is accomplished by forming the loop from at least one and preferably multiple sub-loops. This may be accomplished by connecting first and second conductors between a first bonding pad on the chip and a first input/output pin of the package, and third and fourth conductors between a second bonding pad on the chip and a second input/output pin of the package. A fifth conductor connects the first and second input/output pins. This fifth conductor may include a metallization layer included on a surface of the substrate or within a sub-surface layer of the package. The first and second input/output pins may be adjacent pins within the package, or these pins may be separated by at least a third input/output pin. The first through fourth conductors are preferably bonding wires.

In accordance with another embodiment, the semiconductor package comprises an integrated circuit chip and an inductor loop which is connected in a self-contained manner within the package. This inductor loop is formed by first and second conductors which connect a first bonding pad on the chip to a first input/output pin of the package, and a third and fourth conductors which connect a second bonding pad on the chip to a second input/output pin of the package. In order to complete the multi-loop configuration, the first and second input/output pins are adjacent and contact one another within the package. Also, the first through fourth conductors may be bonding wires.

In accordance with another embodiment, the semiconductor package comprises an integrated circuit chip and an inductor loop which is connected in a self-contained manner within the package. This inductor loop includes first and second conductors which connect a first bonding pad on the chip to a first input/output pin of the package, and third and fourth conductors which connect a second bonding pad on the chip to a second input/output pin of the package. In order to complete the loop, the first and second input/output pins are made to have a unitary construction. Also, the first through fourth conductors may be bonding wires.

In accordance with another embodiment, the semiconductor package comprises an integrated circuit chip and an inductor loop which is connected in a self-contained manner within the package. This inductor loop includes first and second conductors which connect a first bonding pad on the chip to a first input/output pin of the package, and third and fourth conductors which connect a second bonding pad on the chip to a second input/output pin of the package. In order to complete the loop, one or more bonding wires are included for connecting the first and second input/output pins. The first through fourth conductors may also be bonding wires.

The present invention is also an oscillator circuit comprising an active oscillator having two output nodes, an inductor loop coupled to the output nodes, and at least one capacitive circuit coupled to one of the output nodes. The capacitive circuit includes a capacitor, a resistor, and a first switch, where the resistor provides a bias voltage to the capacitor when the first switch is open and the first switch couples and decouples the capacitor to the output nodes of the active oscillator. The active oscillator and capacitive circuit are preferably included in a semiconductor package which includes an integrated circuit chip.

The inductor loop includes first and second conductors connecting a first bonding pad on the chip to a first input/output pin of the package, at least one of a third conductor and a fourth conductor connecting a second bonding pad on the chip to a second input/output pin of the package, and a fifth conductor connecting the first input/output pin to the second input/output pin. The first, second, third, and fourth conductors may be bonding wires and the fifth conductor may include a metallization layer either within or on a surface of a substrate of the package. Alternatively, the fifth conductor may include at least one bonding wire connecting the first input/output pin to the second input/output pin, and in one variation the fifth conductor includes at least two bonding wires. The first and second input/output pins may be adjacent pins or ones separated by at least a third input/output pin. In additional embodiments, the oscillator circuit of the present invention includes other embodiments of the inductor loop described above.

DESCRIPTION OF THE PREFERRED EMBODIMENTS

The present invention is, in one respect, a semiconductor package having an integrated circuit chip and an inductor loop which is connected in a self-contained manner within the package. The present invention is also a system which is at least partially controlled by the inductor loop of the semiconductor device mentioned above. The system may be a communications system where the inductor loop is used to set a transmitter and/or RF carrier frequency or another type of system. The various embodiments of the invention will now be discussed in seriatim below.

Figure 1:
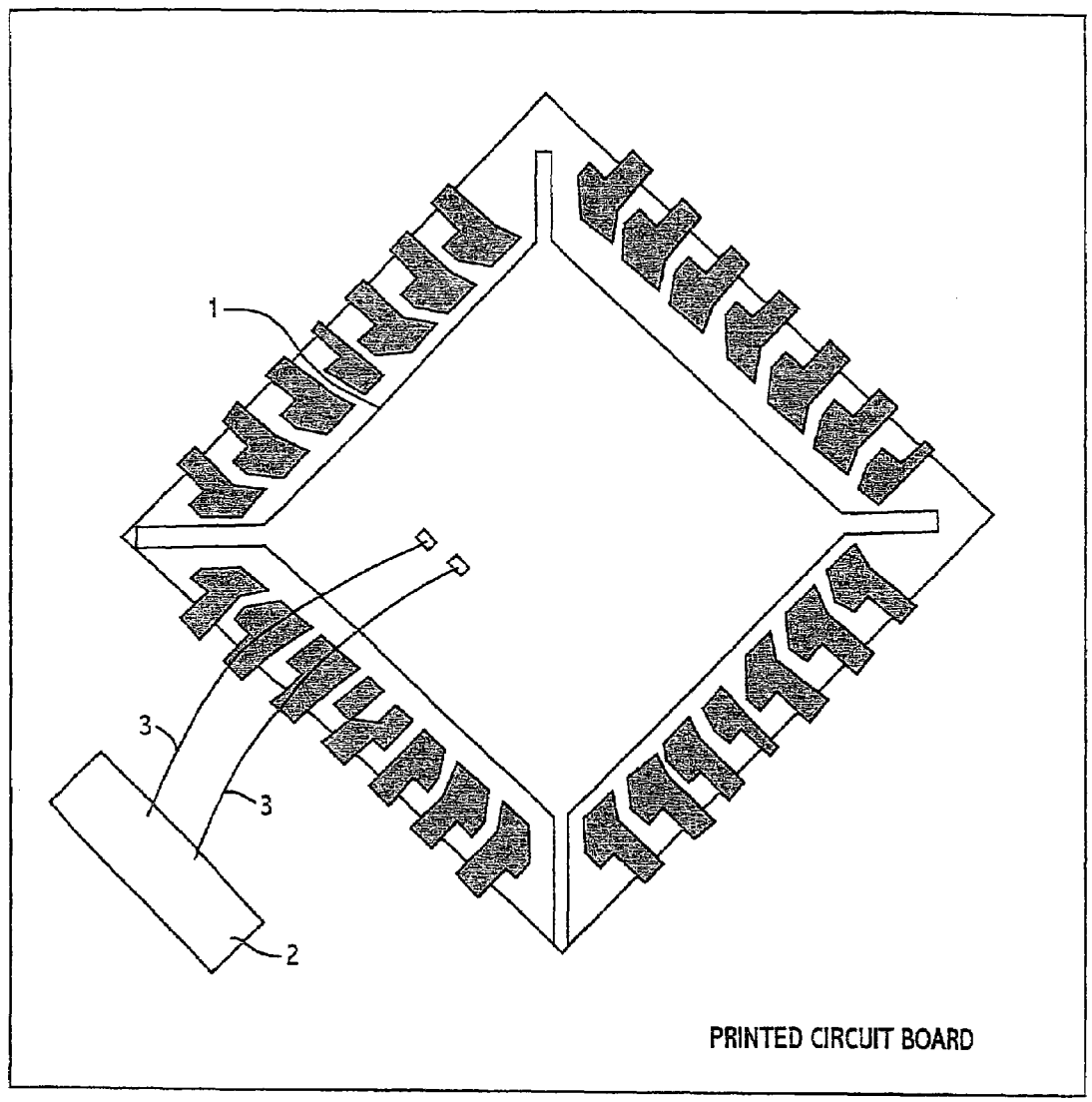
FIG. 1 is a diagram showing a conventional integrated circuit package which is not self-contained.
Figure 2:
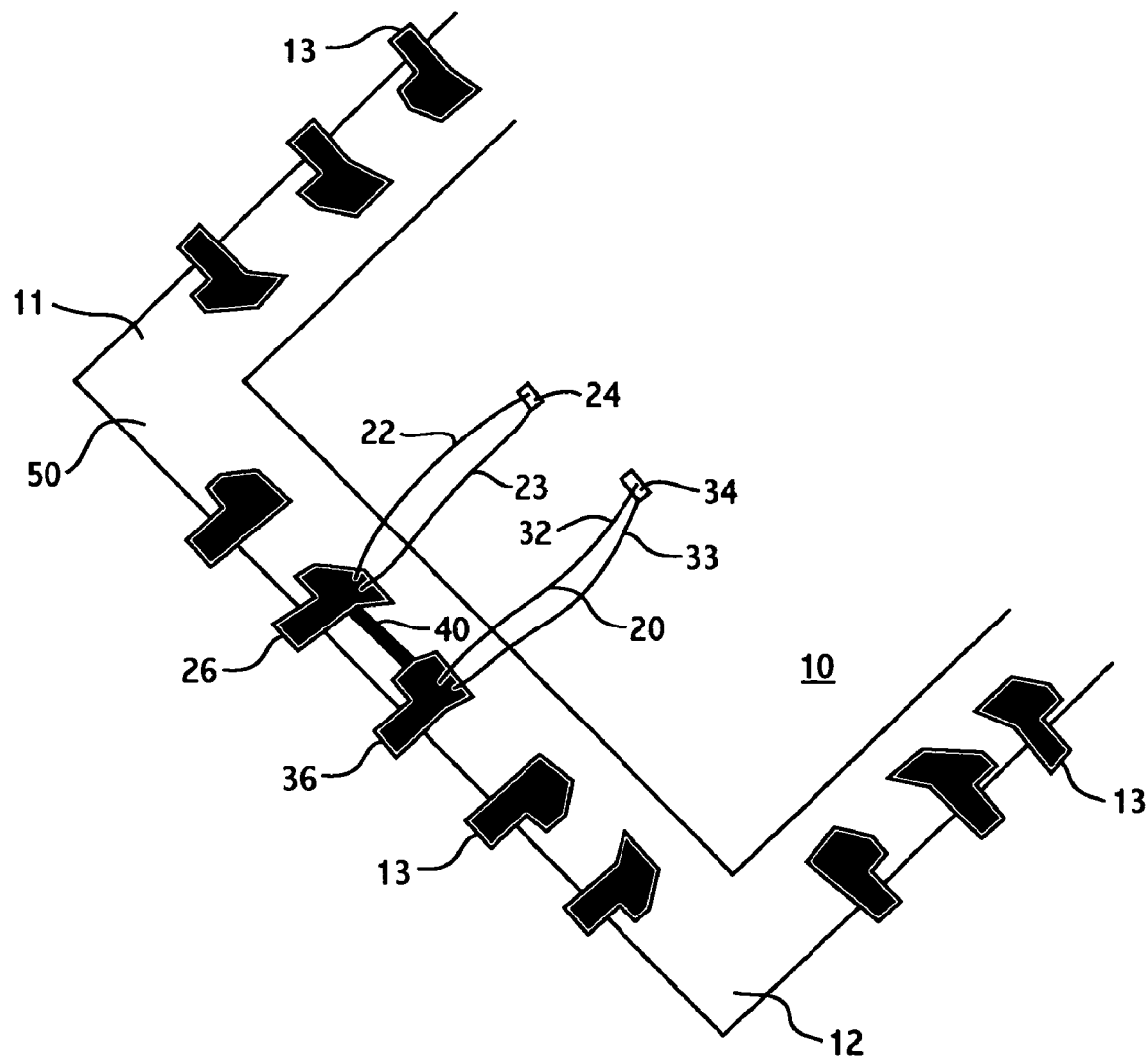
FIG. 2 is a diagram showing a semiconductor package in accordance with a first embodiment of the present invention.

FIG. 2 shows a semiconductor package in accordance with a first embodiment of the present invention. This package includes an integrated circuit chip 10 mounted on or within a package housing 11. The housing includes a substrate 12 for supporting the chip and a plurality of input/output (I/O) pins 13 formed on the substrate for electrically connecting the chip to one or more external circuits (not shown). The substrate may be any type known and the I/O pins may be connected to the chip using any one of a variety of conventional attachment techniques, including but not limited to wire bonds and solder bumps. Examples of packages of this type include lead frame packages, ball grid array (BGA) packages including those using tape automated bonding (TAB), pin grid array packages (PGA), thin small outline packages (TSOP), small outline J-lead packages (SOJ); small outline packages (SOP), and chip scale packages (CSP) to name a few.

The I/O pins may take any one of a variety of forms. For example, the pins are shown as external package leads disposed along a periphery of the package substrate. However, if desired the pins may be formed in other ways including but not limited to electrically conductive vias which extend through the package substrate to solder bump connections provided on an opposing side of the package.

The semiconductor package also includes an inductor loop 20 self-contained within the package. The inductor loop is formed from multiple loops using a plurality of conductors. A first sub-loop is formed by connecting first and second conductors 22 and 23 between a first bonding pad 24 on the chip to a first input/output pin 26 of the package. A second sub-loop is formed by connecting third and fourth conductors 32 and 33 between a second bonding pad 34 on the chip to a second input/output pin 36 of the package. Inclusion of the second sub-loop is optional. For example, a single conductor may be used to connect pad 34 and pin 36. Alternatively, additional sub-loops may be formed by connecting three or more conductors between pad 24 and pin 26 or between pad 34 and pin 36, or both. The first through fourth conductors are preferably bonding wires.

To complete the loop, a fifth conductor is included to connect the first and second input/output pins. The fifth conductor includes a metallization layer 40 which may be formed in a variety of ways. One way involves forming layer 40 on the upper surface 50 of the package substrate. As shown in FIG. 2, this layer is preferably formed so that ends juxtapose pins 26 and 36 respectively. The metallization layer may be formed using any known technique including but not limited to ion implantation and plasma etching. Further, the metallization layer is preferably formed on the substrate before the integrated circuit chip is mounted within the package. As an alternative, the metallization layer may be formed before mounting of the chip and even before I/O pins are formed on or attached to the substrate. In this latter case, the first and second I/O pins may be connected to or formed on top of the metallization layer after its formation to thereby complete the inductor loop.

Once the inductor loop is formed, it may be used to control one or more circuits on the integrated circuit chip. For example, if the integrated circuit includes a phase-locked loop, the inductance value of the loop may be used to set an output frequency or frequency band of this circuit. Alternatively, the length of the loop may be used to set other operational parameters of the chip. The specific application of the inductor loop of the present invention may be adapted, for example, depending upon the parameters being set and the specific function to be performed by the integrated circuit.

The inductance value of the loop depends on its overall length. This length may be set in various ways to achieve the desired inductance value. For example, lengths of the conductors may be set to achieve a desired overall loop length. In addition or alternatively, different numbers of sub-loops may be included between respective pins and pads until a desired loop length, and thus inductance value, is achieved. Preferably, the input/output pins connected in the loop are adjacent one another on the circuit package. However, if desired, these pins may not be adjacent. In this case, the distance between the pins connected in the loop contribute to a loop length which corresponds to the desired inductance value.

Figure 3A:
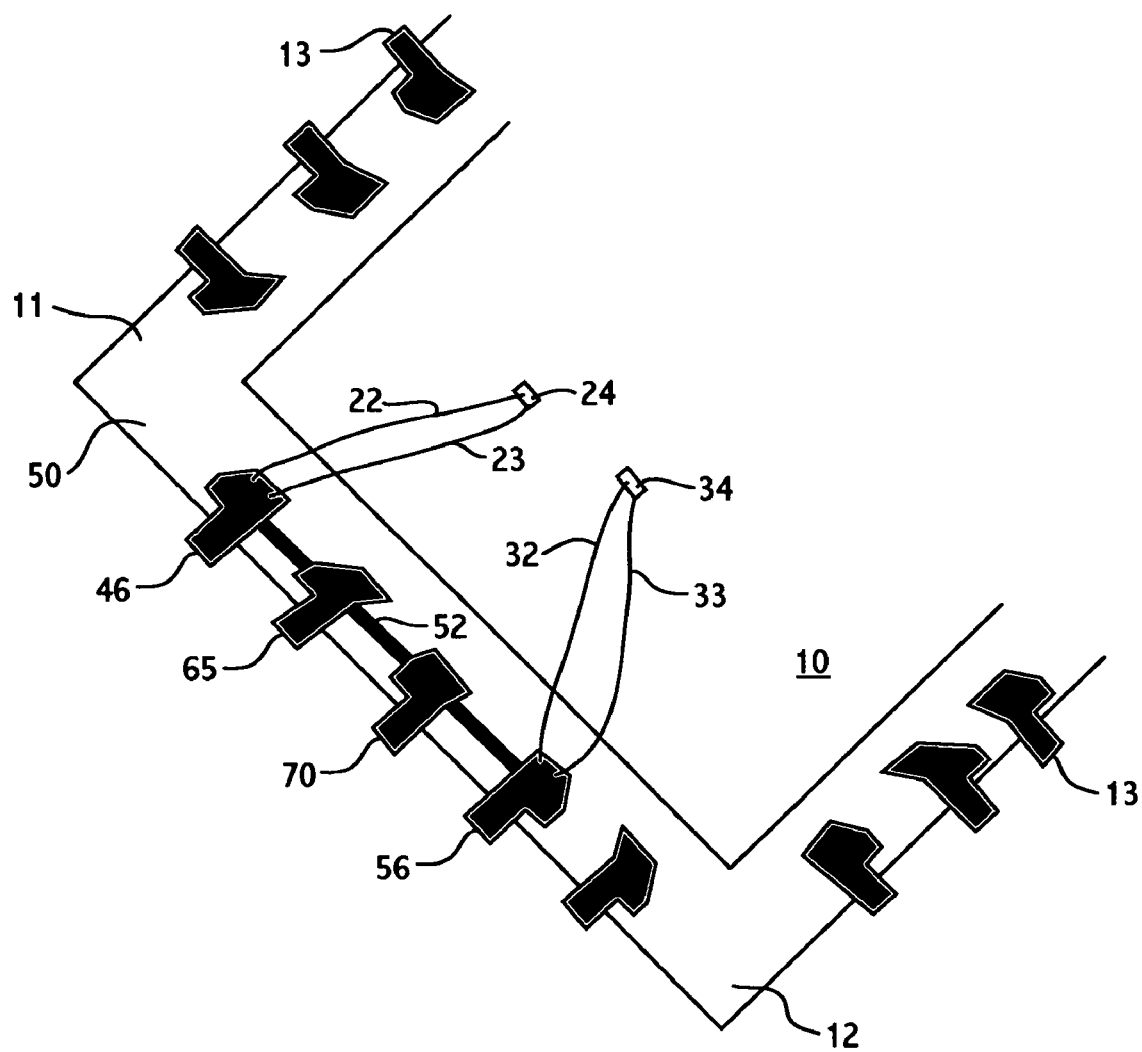
FIGS. 3(a) and 3(b) are diagrams showing examples of how a metallization layer in the semiconductor package of the first embodiment of the present invention may be formed relative to one or more interim input/output pins of the package.
Figure 3B:
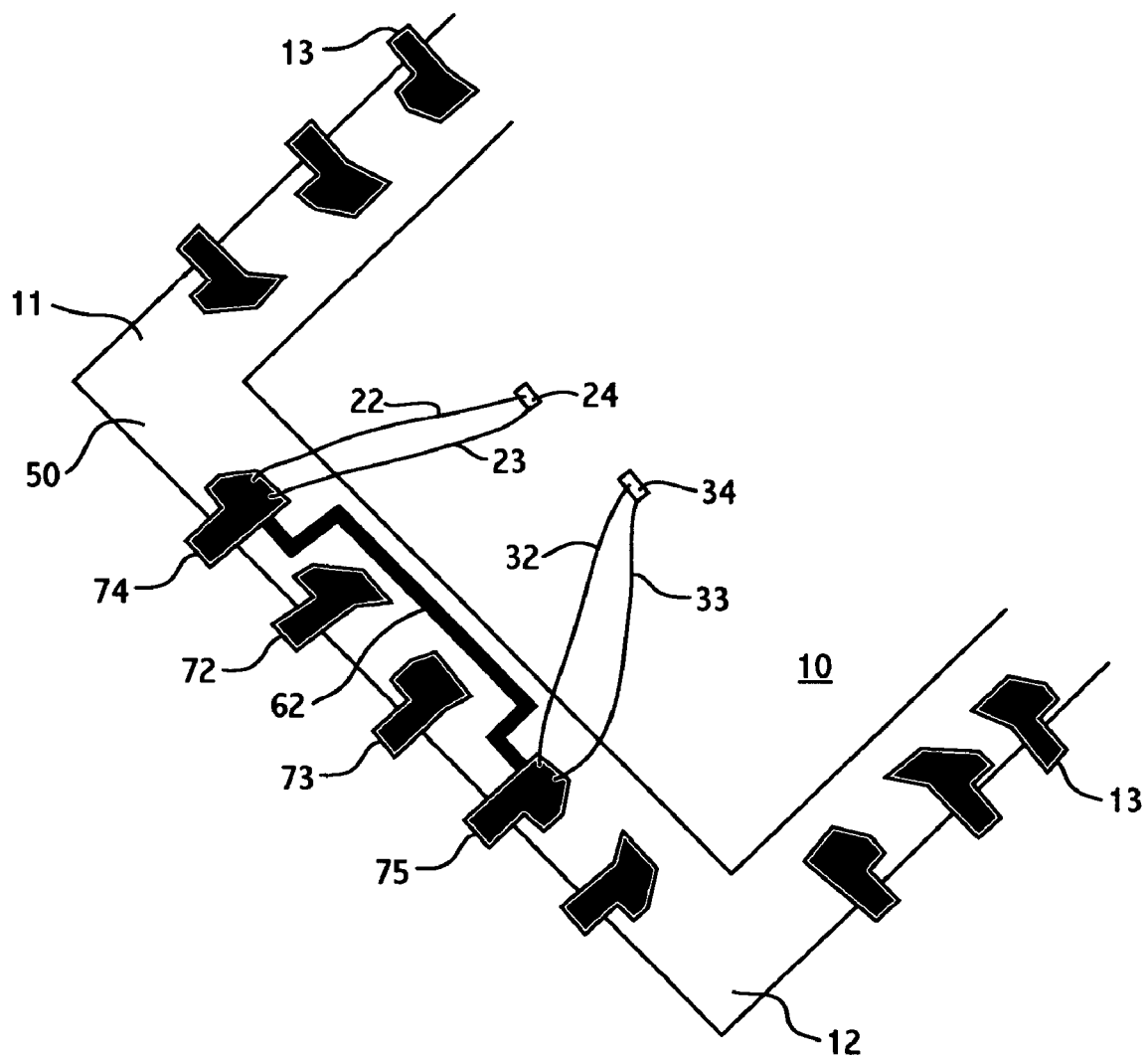

FIGS. 3(a) and 3(b) provide examples of this latter variation of the invention. In both figures, interim pins 65 and 70 are located between pins 46 and 56 connected in the inductor loop. In FIG. 3(a), the surface metallization layer 52 passes underneath the interim pins. These pins preferably are not connected to the chip. Otherwise, the metallization layer may short the circuit connected to the pins. In FIG. 3(b), the surface metallization layer 62 is deposited along a path which averts contact with the interim pins 72 and 73 to connect pins 74 and 75. As a result, the interim pins may be connected to the chip circuitry without producing any shorting effects. In accordance with another alternative, the length of the inductor loop may be varied using a combination of the foregoing techniques.

Figure 4:
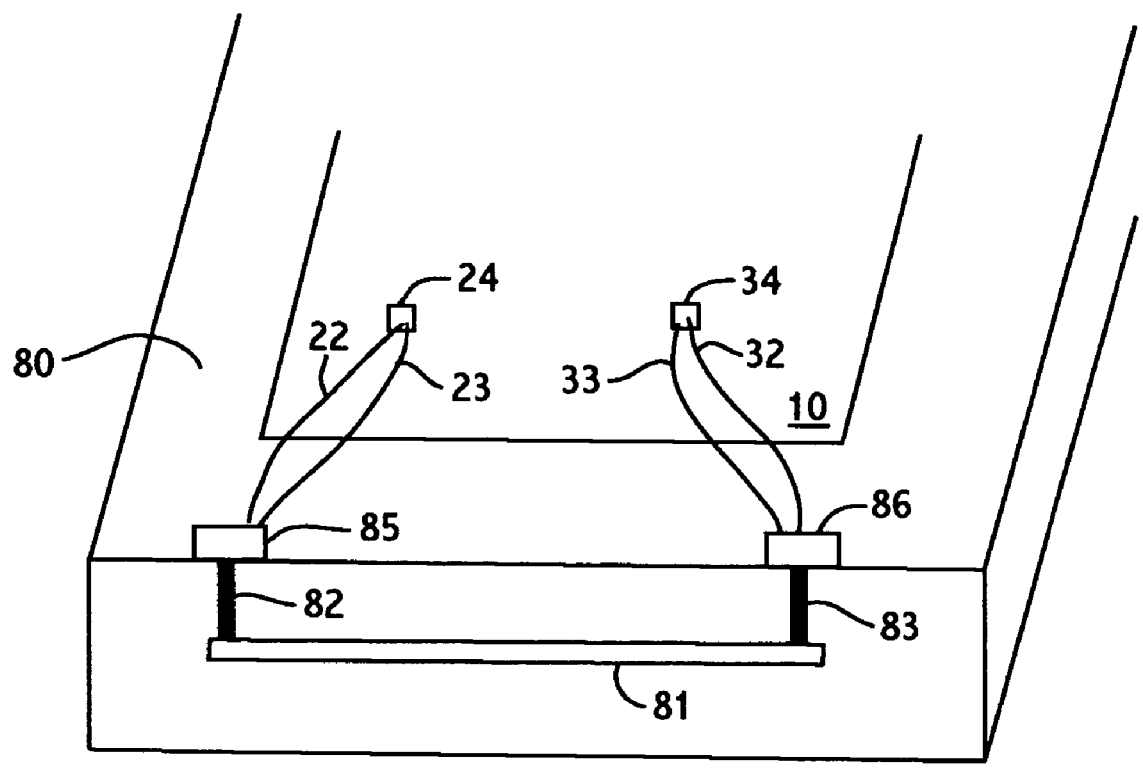
FIG. 4 is a diagram showing another way in which a metallization sub-layer may be formed in the semiconductor package of the first embodiment of the present invention.
Figure 5:
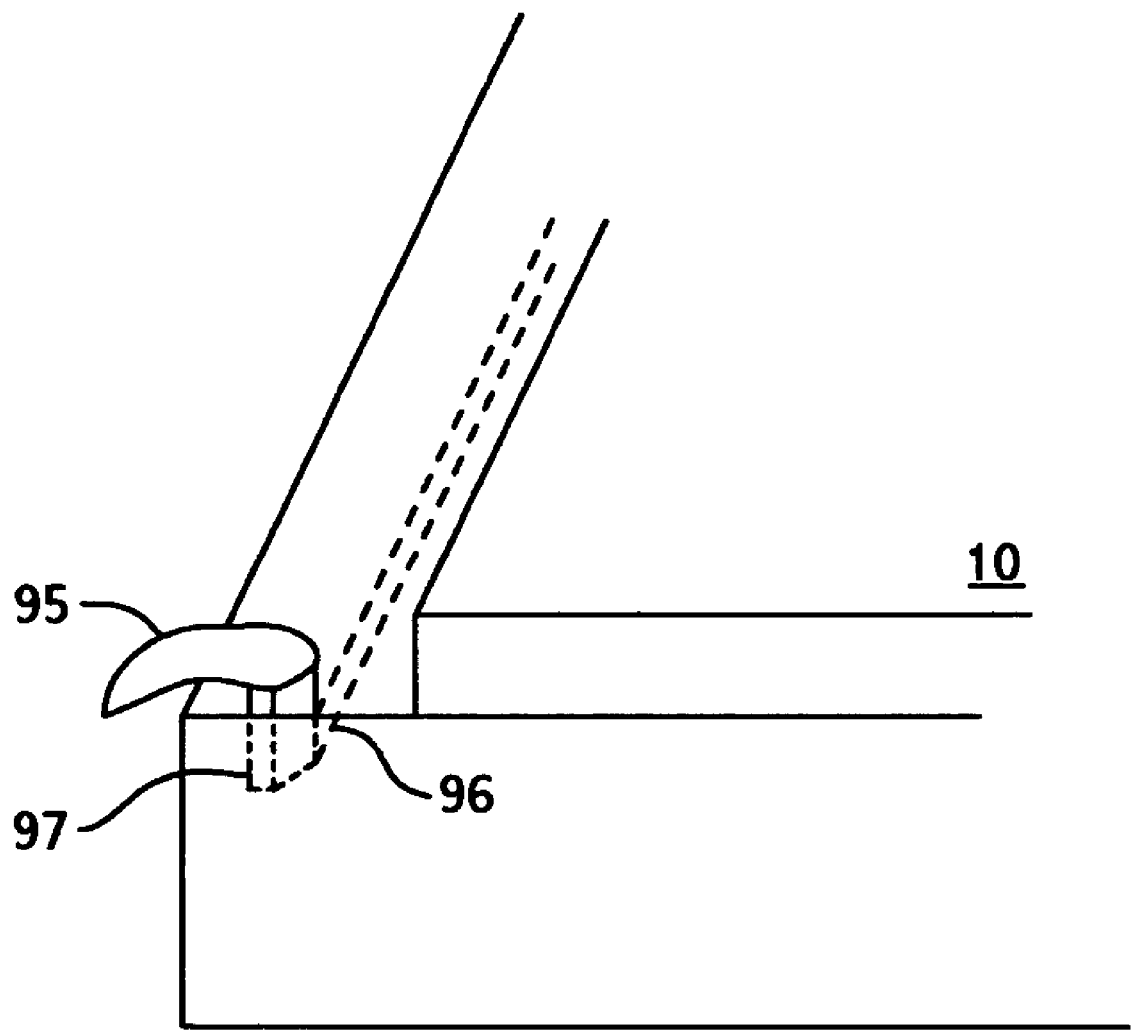
FIG. 5 is a diagram showing one way in which input/output pins may contact the metallization sub-layer shown in FIG. 4.

FIG. 4 shows that another way of forming the metallization layer is to include it in a sub-layer of the package substrate. In this figure, layer 80 is the surface layer of the substrate, layer 81 is the underlying metallization layer which may or may not be immediately adjacent to the surface layer, and conductive vias 82 and 83 connect pins 85 and 86 to the metallization layer. As an alternative to the conductive vias, at least one and preferably both the input/output pins connected in the loop have protruding portions 95 and 97 (FIG. 5) that respectively contact the underlying metallization layer. FIG 5 shows this variation of the present invention in cross-section, wherein for illustrative purposes only input/output pin 95 is shown contacting underlying metallization layer 96 by protruding portion 97.

Figure 6:
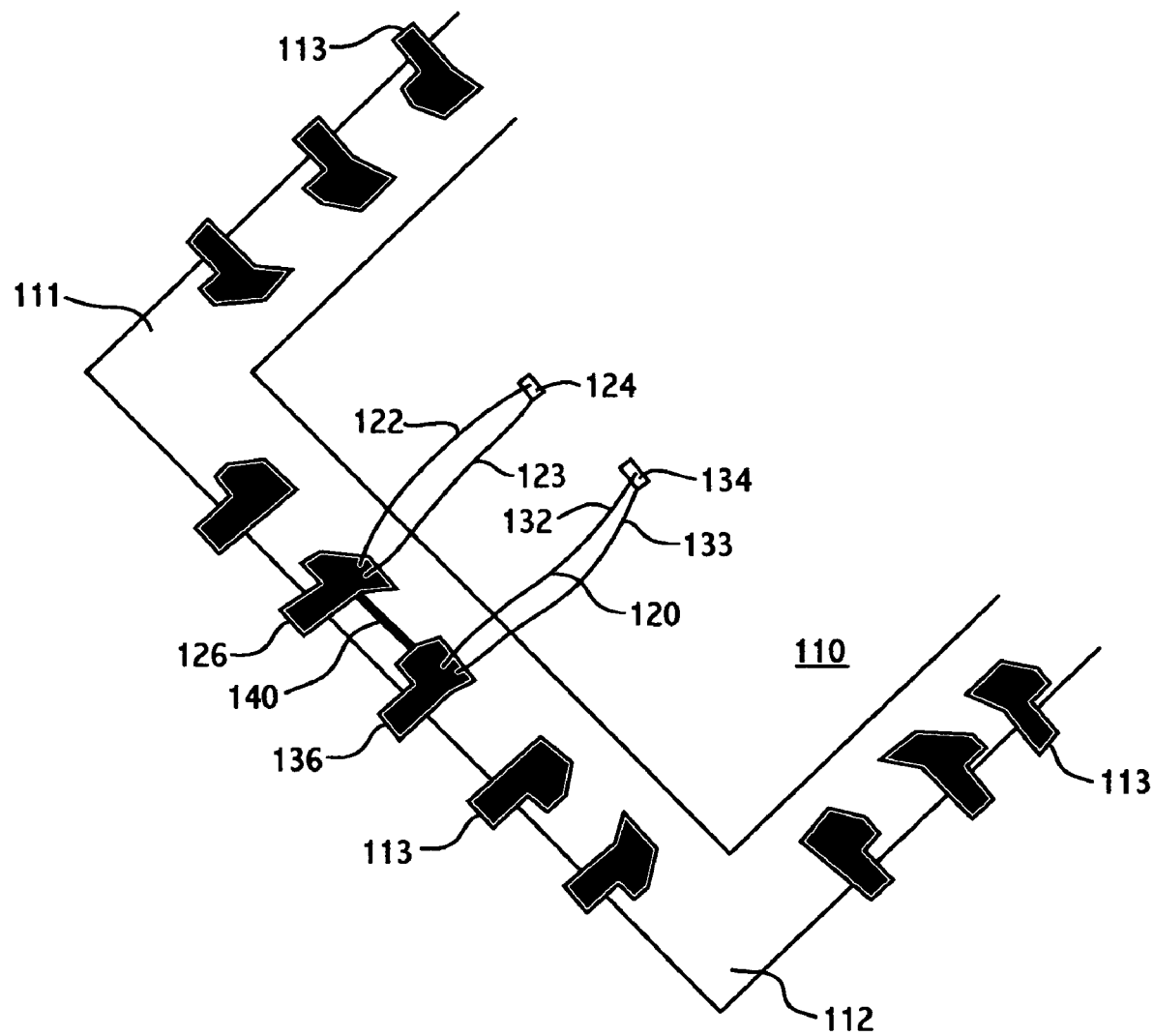
FIG. 6 is a diagram showing a semiconductor package in accordance with a second embodiment of the present invention.

FIG. 6 shows a semiconductor package in accordance with a second embodiment of the present invention. This package includes an integrated circuit chip 110 mounted on or within a package housing 111. The housing includes a substrate 112 for supporting the chip and a plurality of input/output (I/O) pins 113 formed on the substrate for electrically connecting the chip to one or more external circuits (not shown). The substrate may be made from a material and the I/O pins may be formed and connected in any of the ways noted in the discussion of the first embodiment.

The semiconductor package also includes an inductor loop 120 self-contained within the package. The inductor loop has a multi-loop configuration, where a first sub-loop is formed by connecting first and second conductors 122 and 123 between a first bonding pad 124 on the chip to a first input/output pin 126 of the package. A second sub-loop is formed by connecting third and fourth conductors 132 and 133 between a second bonding pad 134 on the chip to a second input/output pin 136 of the package. The first through fourth conductors are preferably bonding wires. Unlike the first embodiment, at least one additional bonding wire 140 is included to connect the pins 126 and 136. Connection between these pins ensures that the loop is completed and a desired inductance value based on the overall length of the loop is established. Once the inductor loop is formed, it may be used to control one or more circuits on the integrated circuit chip.

The foregoing embodiment may be varied in a number of ways. For example, one of the sub-loops may be replaced by a single conductor. Alternatively, more than one sub-loop may be connected between pad 124 and pin 126 or between pad 134 and pin 136, or both. Also, the number of sub-loops connected between each pad-pin pair may be different from one another.

Figure 7:
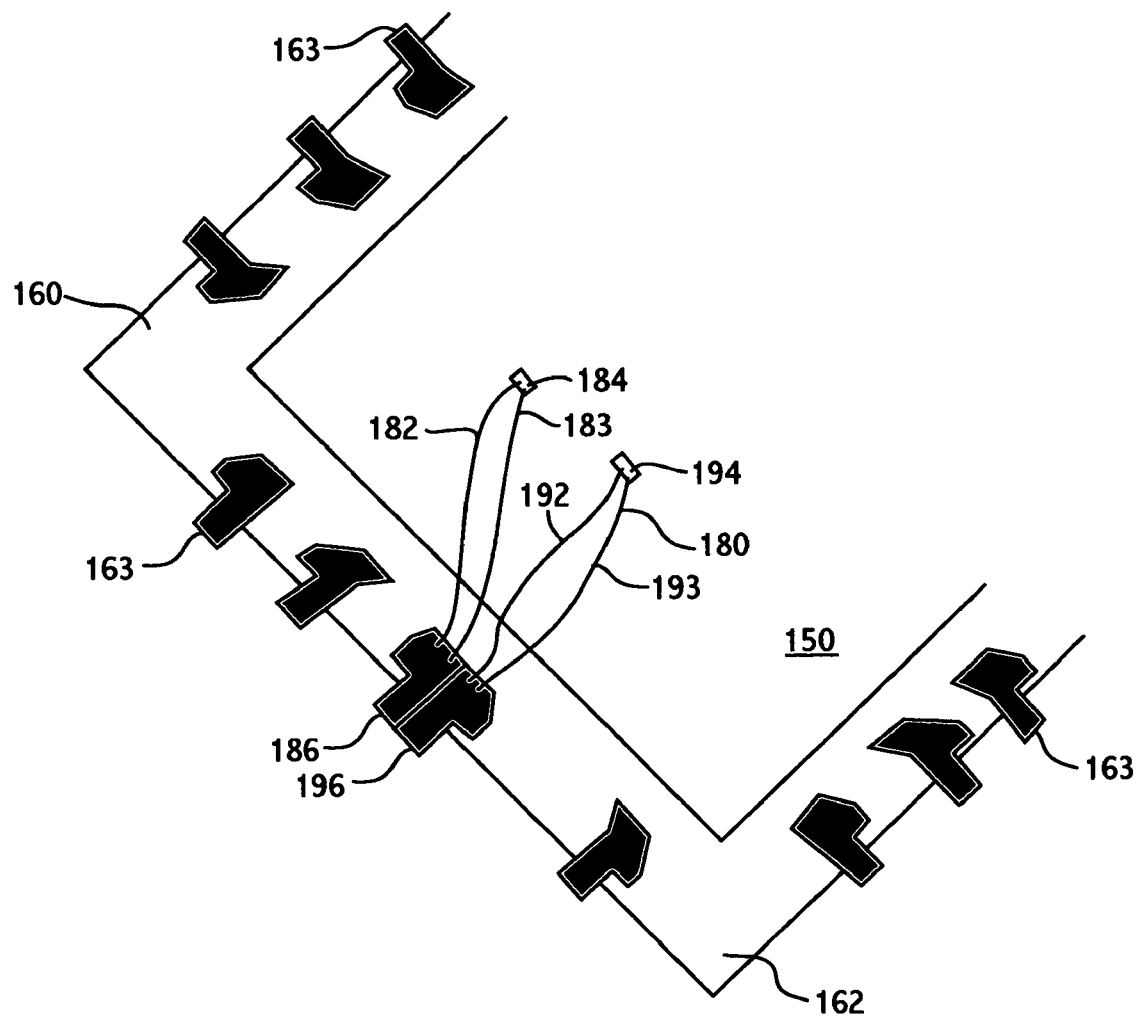
FIG. 7 is a diagram showing a semiconductor package in accordance with a third embodiment of the present invention.

FIG. 7 shows a semiconductor package in accordance with a third embodiment of the present invention. This package includes an integrated circuit chip 150 mounted on or within a package housing 160. The housing includes a substrate 162 for supporting the chip and a plurality of input/output (I/O) pins 163 formed on the substrate for electrically connecting the chip to one or more external circuits (not shown). The substrate may be made from a material and the I/O pins may be formed and connected in any of the ways noted in the discussion of the first embodiment.

The semiconductor package also includes an inductor loop 180 self-contained within the package. The inductor loop preferably includes the following sub-loops. A first sub-loop is formed by connecting conductors 182 and 183 between a first bonding pad 184 on the chip to a first input/output pin 186 of the package. A second sub-loop is formed by connecting conductors 192 and 193 between a second bonding pad 194 on the chip to a second input/output pin 196 of the package. The conductors are preferably bonding wires. Unlike the first embodiment, the pins connected within the inductor loop are adjacent and in contact with one another. The contact between these pins ensures that the loop is completed and a desired inductance value based on the length of the loop is established. Once the inductor loop is formed, it may be used to control one or more circuits on the integrated circuit chip.

The foregoing embodiment may be varied in a number of ways. For example, one of the sub-loops may be replaced by a single conductor. Alternatively, more than one sub-loop may be connected between pad 184 and pin 186 or between pad 194 and pin 196, or both. Also, the number of sub-loops connected between each pad-pin pair may be different from one another.

Figure 8:
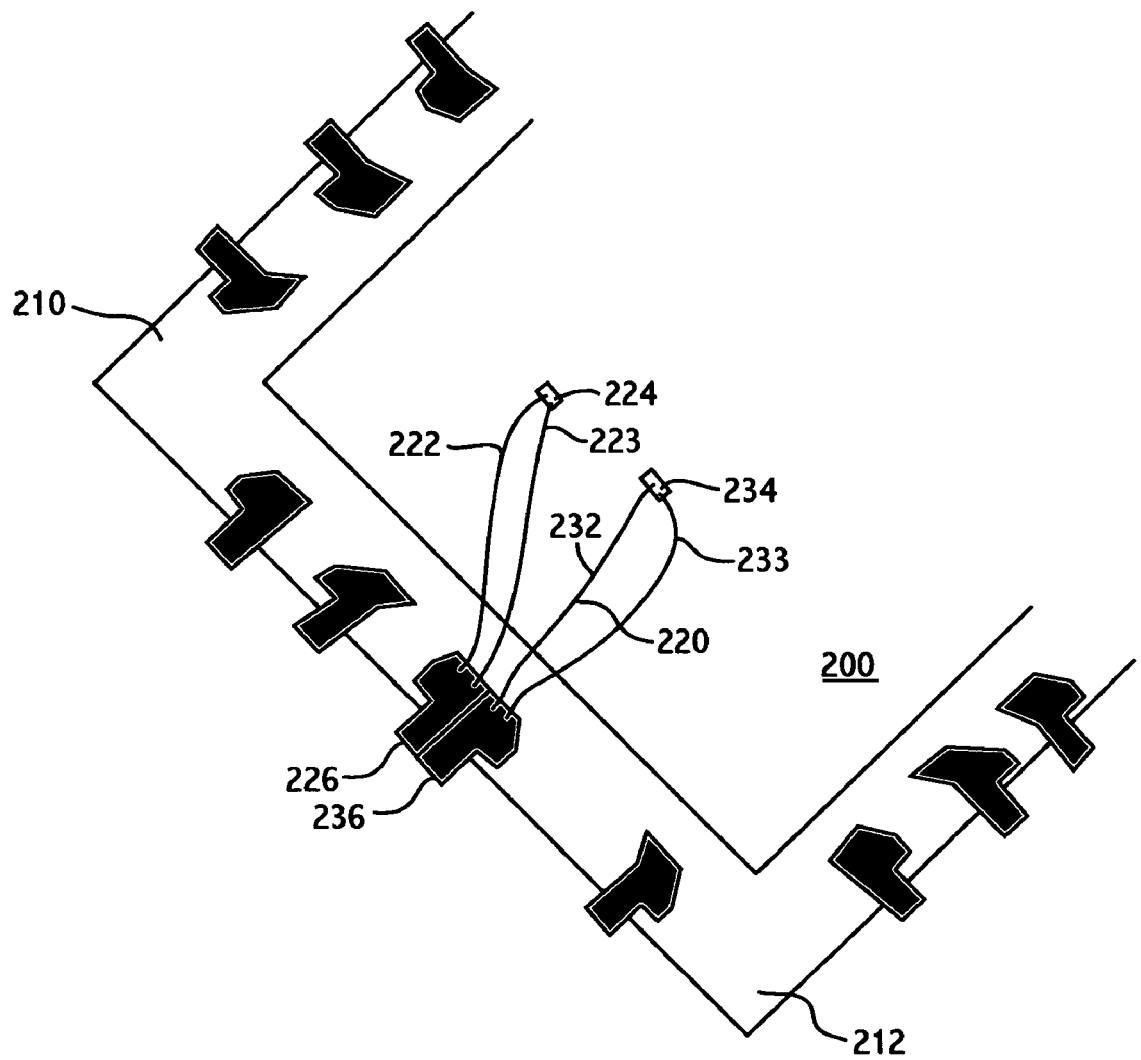
FIG. 8 is a diagram showing a semiconductor package in accordance with a fourth embodiment of the present invention.

FIG. 8 shows a semiconductor package in accordance with a fourth embodiment of the present invention. This package includes an integrated circuit chip 200 mounted on or within a package housing 210. The housing includes a substrate 212 for supporting the chip and a plurality of input/output (I/O) pins 213 formed on the substrate for electrically connecting the chip to one or more external circuits (not shown). The substrate may be made from a material and the I/O pins may be formed and connected in any of the ways noted in the discussion of the first embodiment.

The semiconductor package also includes an inductor loop 220 self-contained within the package. The inductor loop includes a number of sub-loops. A first sub-loop is formed by connecting conductors 222 and 223 between a first bonding pad 224 on the chip to an input/output pin 226 of the package. A second sub-loop is formed by connecting conductors 232 and 233 between a second bonding pad 234 on the chip to a second input/output pin 236 of the package. The conductors are preferably bonding wires. Unlike the first and second embodiments, the pins connected within the inductor loop have a unitary construction; that is, they are formed in one continuous piece although they may each have separate leads 240 and 241 for connection to a printed circuit board or other external circuit. Connecting the first and second conductors to these pins ensures that the loop is completed and a desired inductance value based on the length of the loop is established. Once the inductor loop is formed, it may be used to control one or more circuits on the integrated circuit chip.

A semiconductor package in accordance with any of the aforementioned embodiments may be used in any one of a variety of applications. One exemplary application is in a communication system where the inductor loop is used to set one or more parameters such as but not limited to an operating frequency. One illustrative embodiment of a voltage-controlled oscillator of a type which may be used in such a communication system will now be described.

Voltage-Controlled Oscillator

One exemplary application of the present invention involves the formation of an integrated voltage-controlled oscillator (VCO) of the type disclosed in pending U.S. patent application Ser. No. 10/443,835, the contents of which are incorporated by reference herein. The VCO may be included in a phase-locked loop to provide frequency signals for a variety of well known purposes, but those skilled in the art can appreciate that this VCO application is by no means the only application of the invention. As previously emphasized, the various embodiments of the present invention may be used in virtually any circuit that requires an inductance element. An exemplary embodiment of a VCO application in accordance with the present invention will now be discussed.

Because the phase noise specifications in mobile phone applications are so stringent, allowable types of VCOs are limited and an LC oscillator is usually used. The LC oscillator includes a resonant tank circuit and a few active devices to compensate for energy loss in the tank circuit. Since the tank circuit is a type of band-pass filter, the phase noise performance of the LC oscillator tends to be better than other types of oscillators.

The nominal frequency of the LC oscillator may be expressed in accordance with the following equation:

$$f_{vco} = \frac{1}{2\pi\sqrt{LC}}$$

where $f_{vco}$=the nominal frequency of the VCO, L=the inductance, and C=the capacitance. From this equation, it is apparent that there are at least two ways in which the output frequency of the VCO may be controlled. One way involves varying the capacitor (C) of the oscillator circuit and the other involves varying the inductor value (L). A voltage-controlled oscillator formed in accordance with the present invention sets the inductor value in accordance with any one or more of the inductance-loop embodiments shown in FIGS. 2-8, either alone or with an accompanying adjustment in the capacitance value.

Figure 9:
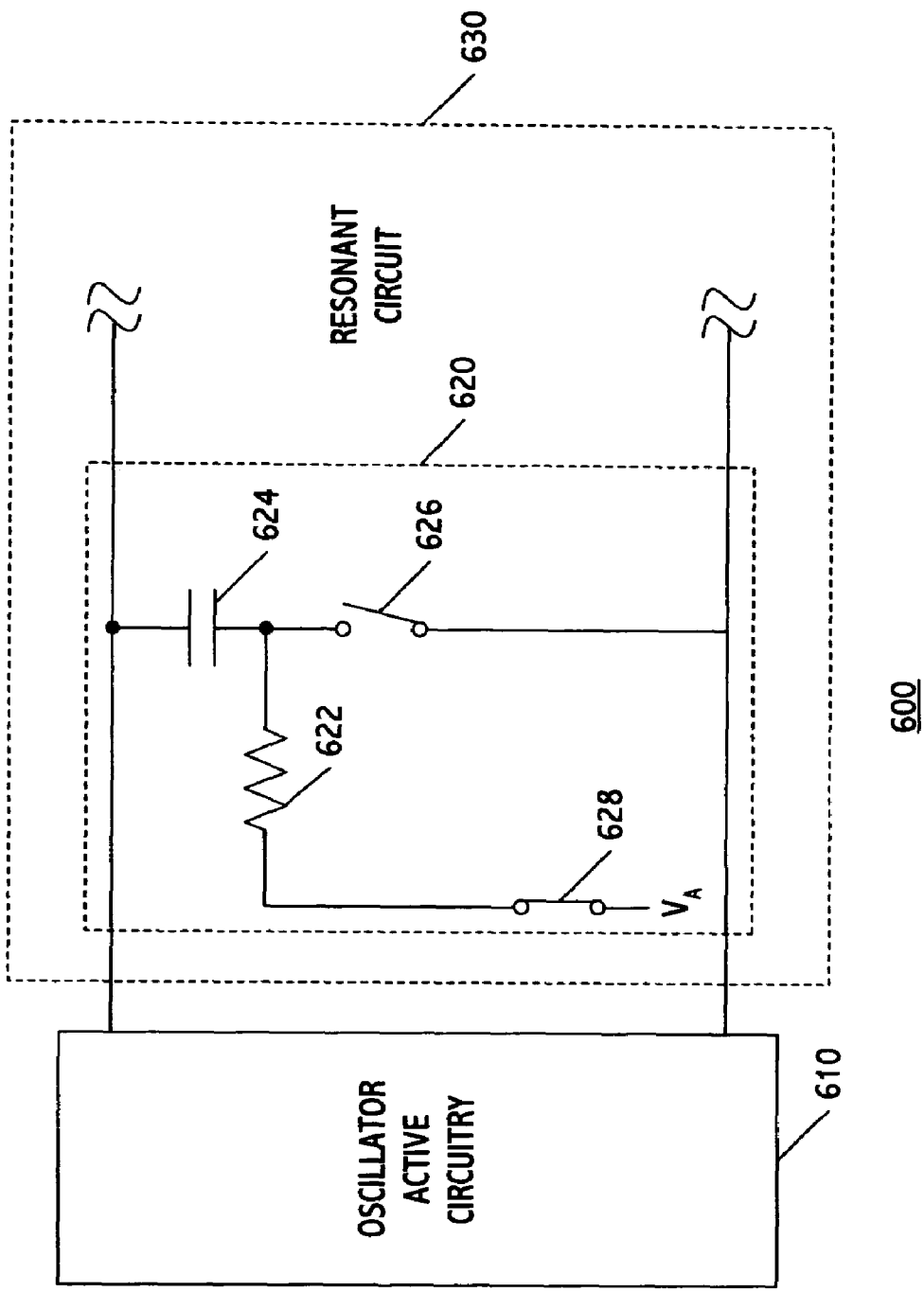
FIG. 9 is a diagram showing a voltage-controlled oscillator in accordance with one embodiment of the present invention.

FIG. 9 is a diagram illustrating an oscillator circuit 600 in accordance with one embodiment of the present invention. This circuit includes an oscillator 610 and at least one adjusting circuit 620 operably coupled to the oscillator 610. The adjusting circuit includes a biasing resistor 622, a reactive element 624 (e.g., a capacitor) and a first switch 626. The first switch 626 selectively couples and decouples the reactive element 624 from the oscillator circuit 600. The biasing resistor 622 provides a bias voltage $V_A$ to the reactive element 624 so that the reactive element 624 has a bias voltage when the first switch 626 is open.

As discussed in detail in the following sections, the bias voltage $V_A$ can be supplied to the reactive element in a variety of configurations. For example, a biasing switch 628 can be located between the bias resistor 622 and the bias voltage $V_A$. The bias switch 628 selectively couples the bias resistor 622 to the bias voltage when the first switch 626 decouples the reactive element 624. The bias switch 628 selectively decouples the bias resistor 622 from the bias voltage $V_A$ when the first switch 626 couples the reactive element 624 to the oscillator circuit 600. Alternatively, the bias resistor 622 can be sized (e.g., a high resistance value) so that the bias voltage $V_A$ can be constantly coupled to the biasing resistor and so that the bias voltage $V_A$ does not substantially change the operating characteristics of the adjusting circuit when first switch 626 is closed.

The bias voltage $V_A$ can be connected to ground voltage, the supply voltage, or a common mode voltage of the oscillator output. Further, the bias voltage $V_A$ can be variable and can be selected from a range from ground voltage to supply voltage. Additionally, switches 626 and 628 can be semiconductor switching devices, such as transistors and the like.

As illustrated in FIG. 9, the adjusting circuit 620 is part of resonant circuit 630. Those skilled in the art will appreciate that resonant circuit 630 can contain additional elements such as inductors, capacitors and resistors. As first switch 626 is opened or closed, reactive element 624 is removed or added from the resonant circuit 630, respectively. Accordingly, the first switch 626 can alter the characteristics of the resonant circuit 630 and thus the frequency of the VCO. Further, additional adjusting circuits can be added to resonant circuit 630 to increase the range of control. Also, those skilled in the art will appreciate that the adjusting circuit of FIG. 9 can be used in either single ended or differential-type oscillators, since the increased tuning range and improved phase noise performance are beneficial to both types of oscillators.

Figure 10:
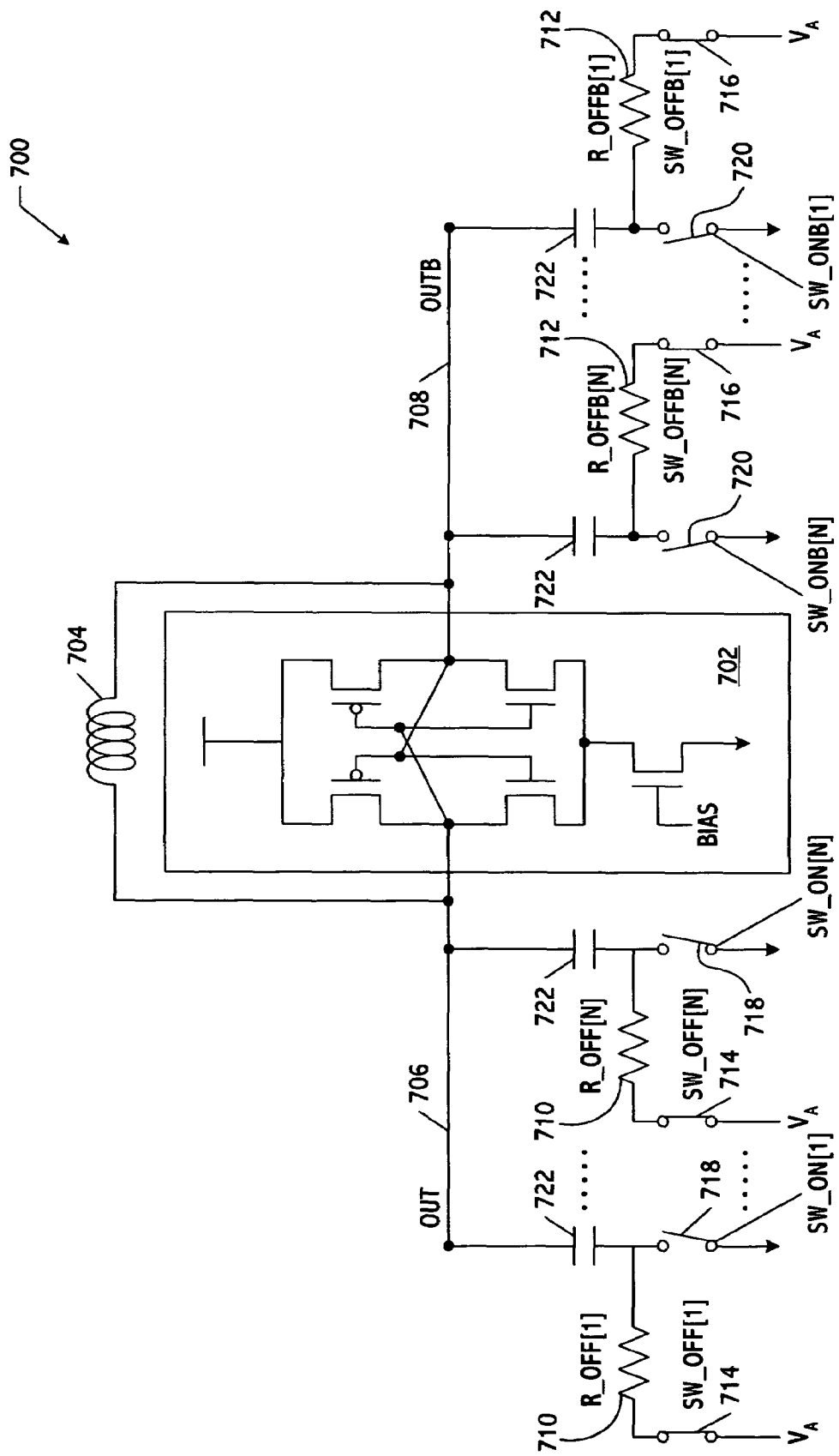
FIG. 10 is a diagram showing a first variation of the voltage-controlled oscillator of FIG. 9.
Figure 11:
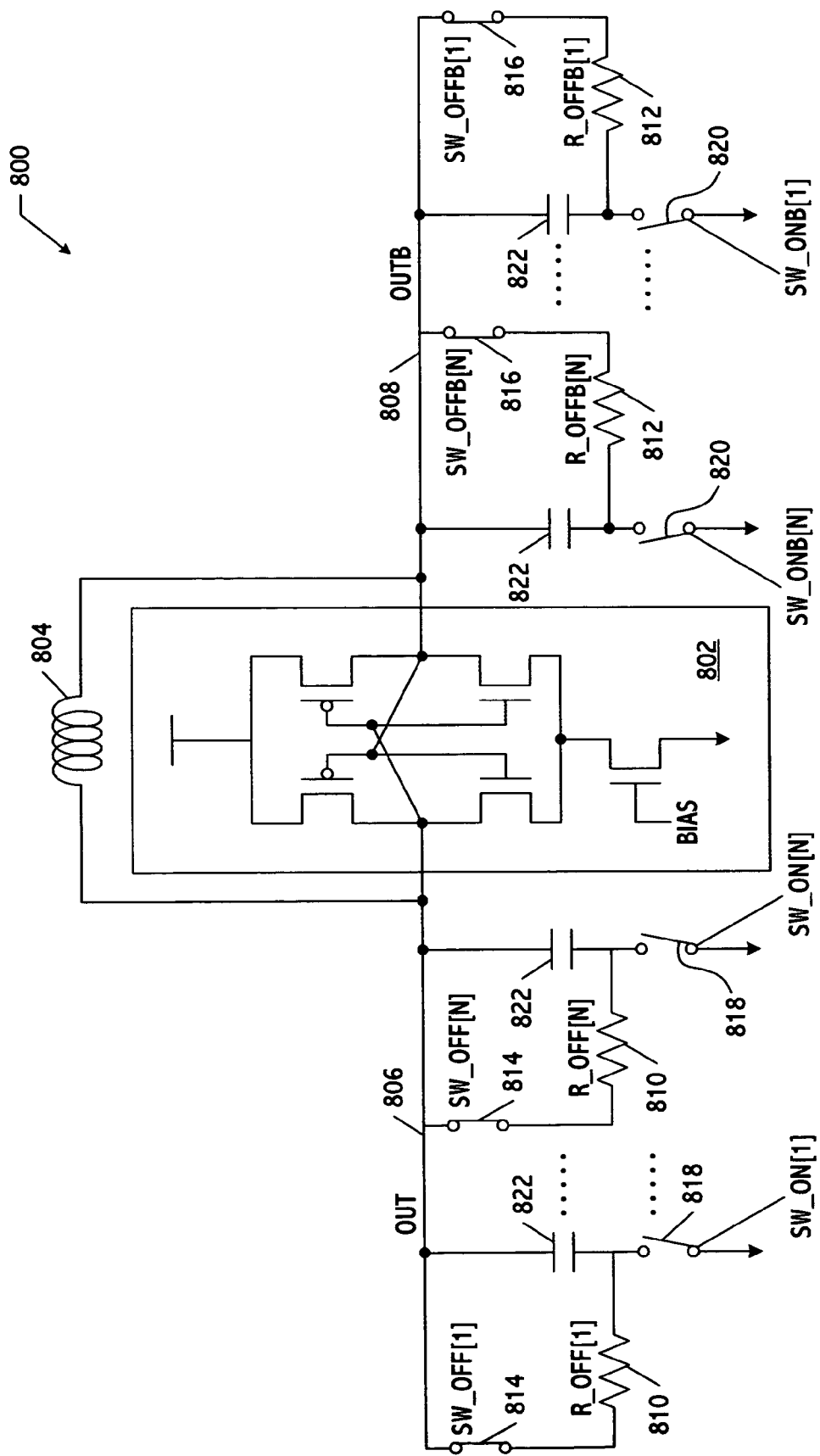
FIG. 11 is a diagram showing a second variation of the voltage-controlled oscillator of FIG. 9.
Figure 12:
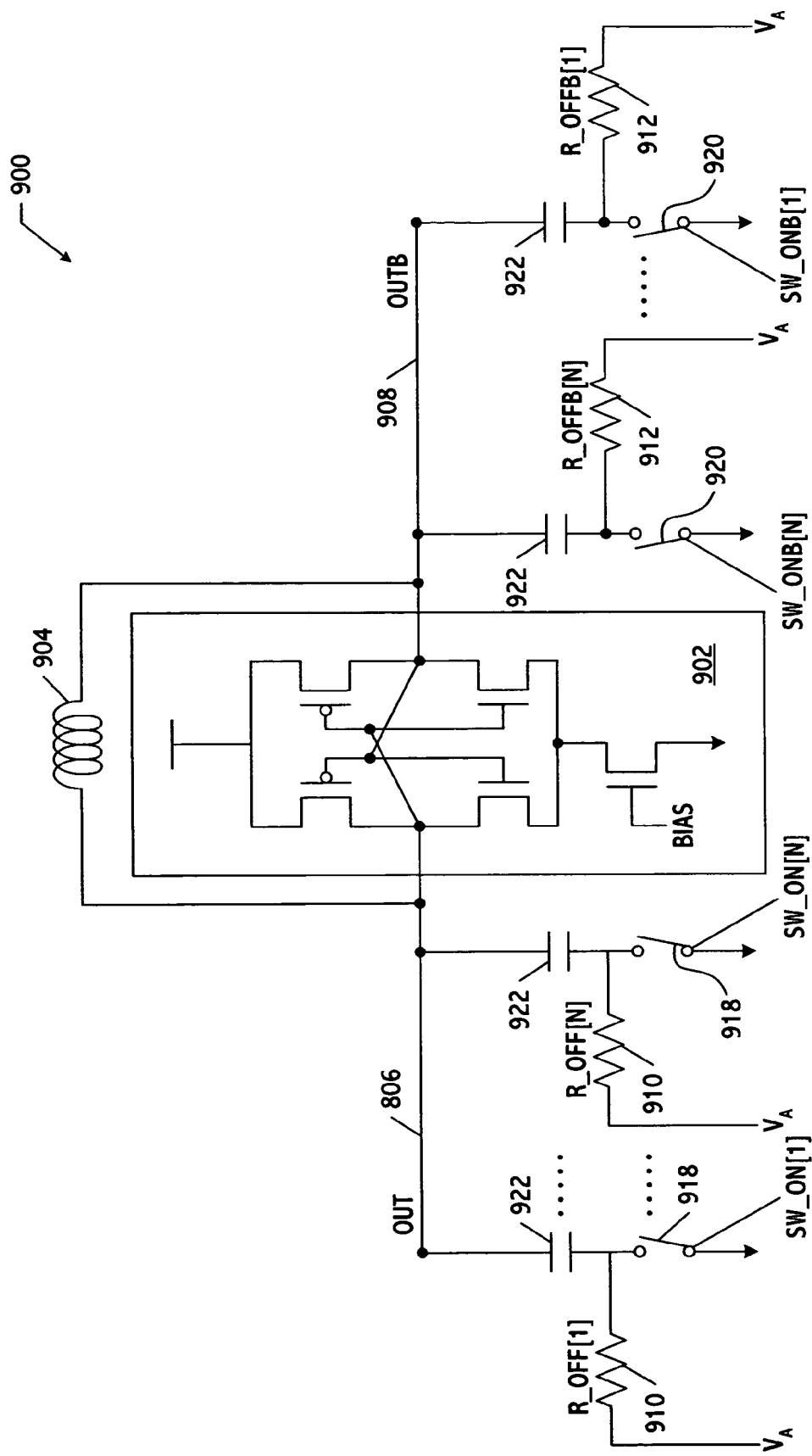
FIG. 12 is a diagram showing a third variation of the voltage-controlled oscillator of FIG. 9.

FIGS. 10-12 show variations of the oscillator circuit of FIG. 9, each of which includes first and second cascaded adjusting circuit stages coupled on either side of the oscillator active circuitry and an inductor loop coupled to the cascaded adjusting stages. A discussion of these variations now follows.

FIG. 10 is a schematic diagram showing a first variation of the voltage-controlled oscillator of the present invention. This variation preferably includes active oscillator circuitry 702 which, for example, may correspond to circuit 610 in FIG. 9. The circuit in FIG. 10 has a differential configuration with output nodes OUT 706 and OUTB 708. An inductor 704 is preferably coupled to the output nodes OUT 706 and OUTB 708. Two or more circuits having a capacitor 722 coupled in series with a switch 718 can also be coupled to OUT 706. The capacitor 722 is coupled to the output node 706 and switch 718. Switch 718 is preferably a transistor switch coupled to a reference voltage, which can be a ground voltage as shown in FIG. 9. In addition, the circuit preferably includes a series coupled resistance and switch such as an explicit resistor 710 coupled in series with transistor switch 714. The explicit resistor 710 is coupled at one end to a common node of capacitor 722 and transistor switch 718, and the transistor switch 714 is coupled between the other end of resistor 710 and a bias voltage $V_A$.

Similar components and connections preferably exist with respect to the output node OUTB 708. For example, a capacitor 722 is preferably coupled in series with transistor switch 720, and the other terminal of the capacitor 722 is coupled to the output node OUTB 708. Further, one terminal of transistor switch 720 is coupled to ground. Moreover, there is preferably an explicit resistor 712 coupled in series with a transistor switch 716 such that the resistor 712 is coupled to a common node of the capacitor 722 and the transistor switch 720, and a terminal of the transistor switch 716 is coupled to the bias voltage $V_A$. Those skilled in the art will appreciate that capacitors 722 can have the same or different values. Likewise, the related resistors and switches can have the same or different values as determined by the specific design requirements of each application.

Operation of the circuit shown in FIG. 10 will now be described. Preferably, the value of the resistors 710 and 712 are determined or optimized for the best phase noise performance in the off-state. Since the resistor value is usually high (e.g., exceeding several KΩ), there is no need for the low on-resistance of the transistor switches 714 and 716. Thus, the size of the transistor switches 714 and 716 can be very small. Also, the additional parasitic capacitance of transistor switches 714 and 716 is small, and because the resistors 710 and 712 are designed to cover most of the resistance in the off-state variation of the characteristics of the transistor switches 714 and 716 are not significant. The bias level $V_A$ determines the common level in the off-state and can have any value from ground to supply voltage. Thus, the bias level $V_A$ can be generated from a simple bias generator such as a resistor divider. $V_A$ can also be ground or supply voltage itself.

FIG. 11 is a schematic diagram showing a second variation of the voltage-controlled oscillator of the present invention. This variation 800 preferably includes active oscillator circuitry 802 which, for example, may correspond to circuit 610 in FIG. 9. The circuit in FIG. 11 has a differential configuration with output nodes OUT 806 and OUTB 808. An inductor 804 is preferably coupled between the output nodes OUT 806 and OUTB 808. A series circuit including a capacitor 822, a resistance shown as an explicit resistor 810, and a switch 814 or the like (e.g., a transistor) is preferably coupled to the output node OUT 806 at one terminal of the capacitor 822 and one terminal of the transistor switch 814, which are opposite ends of the series circuit.

In addition, a switch 818 or the like (e.g., a transistor) is preferably coupled between a reference voltage being ground and a common node of the capacitor 822 and the resistor 810. Similar circuits may be coupled to the output node OUTB 808. For example, a series circuit including capacitor 822, resistor 812, and transistor switch 816 may be coupled to the output node OUTB 808 through one terminal of capacitor 822 and a terminal of transistor switch 816 with the series circuit positioned therebetween. Preferably, transistor switch 820 is coupled between ground and a common node of the capacitor 822 and the resistor 812. Those skilled in the art will appreciate that capacitors 822 can have the same or different values. Likewise, the related resistors and switches can have the same or different values as determined by the specific design requirements of each application.

In the embodiment shown in FIG. 11, there is no need for additional biasing circuitry during the off state. Instead, the common mode voltage of the active circuitry in the LC oscillator provides a proper DC bias to the other terminal of the capacitor not connected to the oscillator output. Also, in VCO 800, a size of transistor switches 814 and 816 can be very small. Thus, the additional parasitic capacitance of transistor switches 814 and 816 is not significant.

FIG. 12 is a schematic diagram showing a third variation of the voltage-controlled oscillator of the present invention. As shown in FIG. 12, the VCO preferably includes active oscillator circuitry 902 which, for example, may correspond to circuit 610 in FIG. 9. This circuit has a differential configuration with output nodes OUT 906 and OUTB 908. Inductor 904 is preferably coupled between the output nodes OUT 906 and OUTB 908. In addition, a capacitor 922 is preferably coupled in series with a switch 918 (e.g., a transistor), where a remaining terminal of capacitor 922 is coupled to the output node OUT 906 and a remaining terminal of transistor switch 918 is coupled to ground. Preferably, there is an explicit resistance preferably being resistor 910 coupled between a common node of the capacitor 922 and the transistor switch 918, and a bias voltage $V_A$.

Similar circuits are preferably coupled to OUTB 908. For example, a capacitor 922 is preferably serially coupled with transistor switch 920, where a remaining terminal of the capacitor 922 is coupled to the output node OUTB 908, and a remaining terminal of the transistor switch 920 is coupled to ground. Preferably, an explicit resistor 912 is coupled between a bias voltage $V_A$ and a common node of the capacitor 922 and the transistor switch 920. Those skilled in the art will appreciate that capacitors 922 can have the same or different values. Likewise, the related resistors and switches can have the same or different values as determined by the specific design requirements of each application.

In the embodiment shown in FIG. 12, turn-off switches (e.g., switches 814 and 816 in FIG. 10) are eliminated with reduced or limited loss of performance. This is because the resistances of explicit resistors 910 and 912 are selected so that they do not severely change the operating characteristics during the on periods of switches 918 and 920. Those skilled in the art will appreciate that the appropriate values for resistors 910 and 912 are determined empirically for a given oscillator design (e.g., capacitance, frequency range, and the like). When switches 918 and 920 are opened to reduce the capacitance, the other terminal not coupled to the oscillator output preferably has its DC bias voltage substantially the same as the common mode voltage of the oscillator 902.

In FIGS. 9-12, the voltage-controlled oscillator may be formed on a chip which is preferably mounted within a self-contained semiconductor package configured in accordance with any of the embodiments of the present invention shown in FIGS. 2-8. Accordingly, the inductor loop of the package may be used as a basis for setting the output frequency of the VCO. More specifically, the length of this loop may be formed to produce an inductance value (corresponding to any one or more of inductors 704, 804, and 904) which causes the VCO to output a desired frequency or operate within a desired frequency band.

For example, in one non-limiting but particularly advantageous application, the loop length may be formed to generate an inductance value of 1.30 nH. This causes a PLL incorporated the VCO to output a frequency of 1.98 GHz, under conditions where the VCO is an RF1-type (e.g., PCS) oscillator and the capacitance is 4.96 pF. Where the VCO is an RF2-type (e.g., CDMA) oscillator with the same capacitance value, the loop length of the inductor may be formed to generate a value of 1.81 nH, which is sufficient to produce an output transmission frequency from the PLL of 1.28 GHz. The manner in which an inductance value may be used to control the output frequency of a PLL is known, and for example may be accomplished in the manner disclosed in U.S. Pat. No. 6,323,735, the contents of which is herein incorporated by reference. The inductor loop may also be used in conjunction with multi-phase clock signals in a manner to be disclosed in greater detail below.

As previously noted, a voltage-controlled oscillator in accordance with the present invention may advantageously be used in a PLL circuit to generate frequency (e.g., local oscillator signals) signals in a communications receiver. Those skilled in the art will appreciate, however, that the VCO of the present invention may be used in any other device that uses or can use a PLL or VCO. For example, these devices include a receiver, transmitter, transceiver, wireless communication device, base station, or mobile unit (e.g., cellular phones, PDA's, pagers, and the like).

It is further noted that a voltage-controlled oscillator formed in accordance with the present invention has various advantages. For example, the tuning range of a PLL may be increased compared with conventional devices of this type. Further, problems associated with turn-on and turn-off conditions of VCO adjusting circuitry may be substantially reduced or even eliminated. In addition, the size of the transistor switches can be reduced which thereby promotes miniaturization.

Those skilled in the art will also recognize that methods are disclosed in the foregoing description for tuning a device having an oscillator circuit. These methods comprise, for example, providing a bias voltage via a bias resistor to a reactive element so that the reactive element has a bias voltage when a first switch is open, using the first switch to couple or decouple the reactive element from the oscillator circuit and coupling, the bias resistor to the bias voltage with a second switch. Further, the method can include opening the second switch if the first switch is closed and closing the second switch if the first switch is open. The method can be applied to a variety of devices such as a PLL, a receiver, a transmitter, a transceiver, a wireless communication device, a base station, and/or a mobile unit.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. An oscillator circuit, comprising:
   an active oscillator having two output nodes;
   an inductor loop coupled to the output nodes; and
   at least one capacitive circuit coupled to one of the output nodes, said at least one capacitive circuit including a capacitor, a resistor, and a first switch, wherein said resistor provides a bias voltage to the capacitor when the first switch is open and wherein said first switch couples and decouples the capacitor to the output nodes of the active oscillator, and wherein the active oscillator and capacitive circuit are included in a semiconductor package which includes an integrated circuit chip, said inductor loop including:
   (a) first and second conductors connecting a first bonding pad on the chip to a first input/output pin of the package;
   (b) at least one of a third conductor and a fourth conductor connecting a second bonding pad on the chip to a second input/output pin of the package; and
   (c) a fifth conductor which connects the first input/output pin to the second input/output pin.

2. The oscillator circuit of claim 1, wherein the first, second, third, and fourth conductors are bonding wires.

3. The oscillator circuit of claim 1, wherein the package has a substrate which includes the fifth conductor as a metallization layer.

4. The oscillator circuit of claim 3, wherein the metallization layer is on a surface of the substrate.

5. The oscillator circuit of claim 1, wherein the first input/output pin and the second input/output pin are separated by at least a third input/output pin.

* * * * *